United States Patent
Wollschlager et al.

[11] Patent Number: 5,442,671
[45] Date of Patent: Aug. 15, 1995

[54] CIRCUIT AND METHOD OF DETECTING ACTUATOR MOVEMENT

[75] Inventors: Randall T. Wollschlager, Chandler; John M. Hargedon, Scottsdale, both of Ariz.

[73] Assignee: Motorola, Inc., Schaumburg, Ill.

[21] Appl. No.: 300,544

[22] Filed: Sep. 6, 1994

[51] Int. Cl.⁶ .......................................... H01H 47/00
[52] U.S. Cl. .................................... 377/55; 377/20; 377/24.1; 73/168; 324/207.11; 324/415; 361/179
[58] Field of Search ................. 361/179, 180; 73/168; 377/55, 20, 24, 24.1; 324/207.11, 207.16, 207.22, 415

[56] References Cited
U.S. PATENT DOCUMENTS

| | | | |
|---|---|---|---|
| 4,851,959 | 7/1989 | Stumpf | 361/159 |
| 5,130,657 | 7/1992 | Hornung | 324/415 |
| 5,289,131 | 2/1994 | Heidt | 324/415 |

Primary Examiner—Kenneth A. Wieder
Assistant Examiner—Jose M. Solis
Attorney, Agent, or Firm—Robert D. Atkins

[57] ABSTRACT

An actuator movement detector (10) indicates proper engagement of a solenoid (12). The current flowing through a field coil (16) is converted to a sense voltage that exponentially increases and then follows a dip before increases again to a steady state value greater than the first peak value. The exponentially increasing sense voltage is stored across a capacitor (24). Any AC variation about the stored sense voltage sets the output state of comparators (30, 32) and determines a first peak value of the sense voltage. After the first peak, a counter (44) must count to a predetermined value during the low peak before the sense voltage returns to its first peak value. If the counter reaches at least the predetermined count value before returning to its first peak value and count back down to zero before reaching steady state, then the solenoid is considered engaged.

20 Claims, 3 Drawing Sheets

CIRCUIT AND METHOD OF DETECTING ACTUATOR MOVEMENT

BACKGROUND OF THE INVENTION

The present invention relates in general to detection circuits and, more particularly, to detecting proper operation of a solenoid.

Electrical solenoids form an integral part of many types of mechanical systems. The electric solenoid includes a field coil that develops a magnetic field in response to current flow through the coil. The magnetic field causes movement of an actuator positioned within the field coil that in turn is attached to a mechanical device such as a valve or gear. By activating a switching circuit, current flows through the field coil to develop the magnetic field and move the actuator. For example, in automotive applications, solenoids are often used to shift gears in the transmission or engage emission control subsystems. In industrial applications, the solenoid may be used to open and close valves in hydraulic lines.

As with most physical devices, solenoids are subject to failure. In many applications it is important to know that the actuator has indeed engaged. For example, federal law requires warning indicators if emission control subsystems fail to properly engage. In the prior art the actuator sensing has been accomplished by pressure sensors, Hall-effect sensors and optoelectronic sensors. In the pressure sensor approach, the pressure sensor detects pressures on opposite sides of the valve. When the valve is open, the pressures on opposite sides of the valve equalize and the pressure sensor indicates a zero differential reading. When the valve is closed, the pressures are generally unequal and the pressure sensor reads the difference. However, even with the closed valve, the pressures on opposite sides of the valve may still be the same causing the pressure sensor to inaccurately indicate an open valve. Moreover, pressure sensors have proven expensive and unreliable in harsh environments such as automotive and industrial applications.

The prior art actuator detectors are designed into the original equipment and generally cannot be added on later without extensive re-design. Therefore, it is often impractical to upgrade existing systems to new technology in actuator detection.

Hence, a need exists for a simple and reliable actuator detector that can be integrated into existing systems.

DETAILED DESCRIPTION OF THE PREFERRED EMBODIMENT

Figure 1:
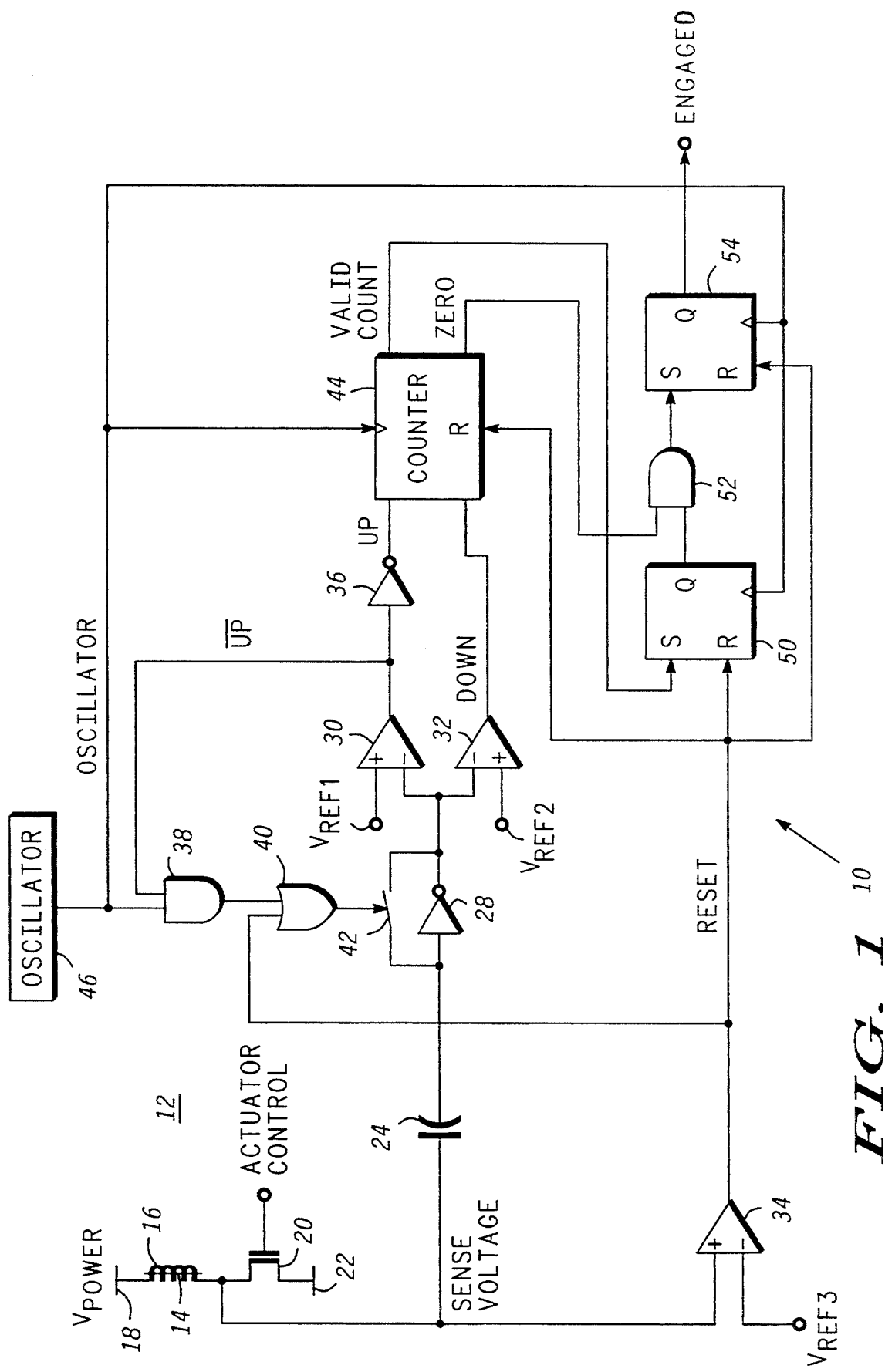
FIG. 1 is a block diagram illustrating an actuator movement detector.

Referring to FIG. 1, an actuator movement detector 10 is shown suitable for manufacturing as an integrated circuit using conventional integrated circuit processes. A solenoid 12 includes an actuator 14 that in turn is coupled to a mechanical device such as a gear or valve (not shown). Solenoid 12 may be used in an automotive application for example to shift gears in the transmission or engage emission control subsystems. In industrial applications, solenoid 12 may be used to open and close valves in hydraulic lines. A field coil 16 surrounds actuator 14 with one end coupled to power supply conductor 18 operating at a positive power supply potential $V_{POWER}$ such as 12.0 volts from an automotive battery. The other end of field coil 16 is coupled to the drain of transistor 20 that receives an ACTUATOR CONTROL signal at its gate. The source of transistor 20 is coupled to power supply conductor 22 operating at ground potential. In an alternate embodiment, transistor 20 may be replaced with a resistor and switching circuit (not shown). A high ACTUATOR CONTROL signal turns on transistor 20 and conducts current through field coil 16 to develop a magnetic field that moves actuator 14 and causes the gear to shift or the valve to close.

Figure 2:
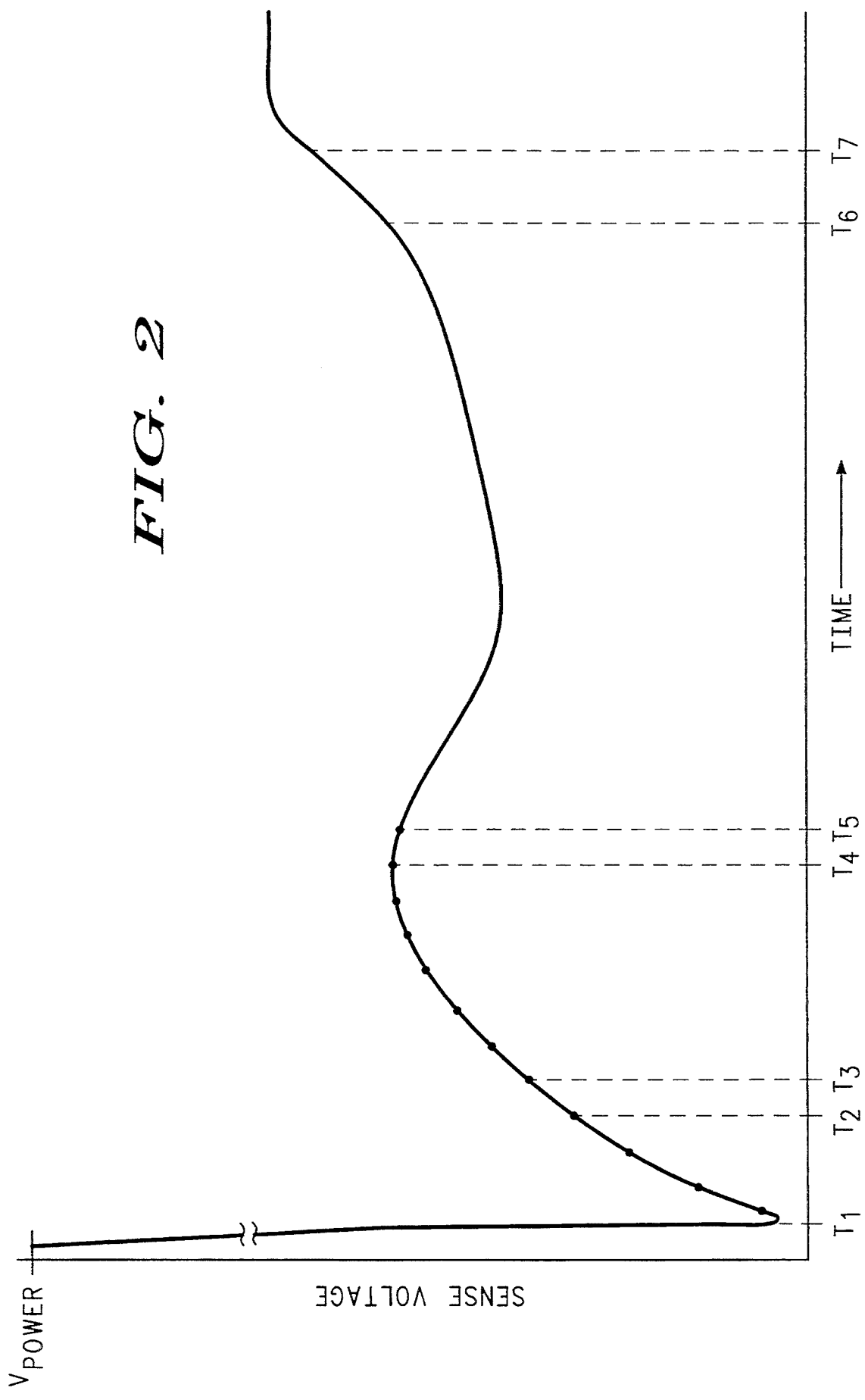
FIG. 2 is a waveform plot useful in the explanation of the invention.

In many applications, it is important to verify proper engagement of solenoid 12. For example, the computer control system in an automobile needs to know when the transmission shifts gears in order to adjust fuel supply and engine RPMs. Actuator movement detector 10 uses the drain-source resistance ($R_{DS}$ ON) of transistor 20 to convert the current waveform in field coil 16 to a voltage waveform as shown in FIG. 2. When properly operating, the SENSE VOLTAGE at the drain of transistor 20 immediately drops to a value near ground potential at time $t_1$. The voltage waveform increases exponentially to a peak value at time $t_4$ and then takes a dip because the field has moved the actuator core thereby increasing the solenoid inductance and inducing a negative di/dt (rate of change of current per unit time) which is converted by the $R_{DS}$ ON of transistor 20 to the voltage dip. The peak to valley change of the SENSE VOLTAGE may be 10.0 millivolts. The dip shown in FIG. 2 is not necessarily to scale. The voltage waveform increases again to a steady state value above the previous peak.

Actuator movement detector 10 begins operation at the initial voltage drop and monitors the waveform to detect the peak value, e.g. at time $t_4$. If the voltage waveform reaches a peak followed by a dip, e.g. between times $t_4$ and $t_6$, that has at least a minimum duration (say 1.0 milliseconds) and exceeds the peak at time $t_4$, then the current through field coil 16 exhibits the expected physical behavior for the device and solenoid 12 is considered engaged. Otherwise, solenoid 12 is determined to be not engaged because the current through field coil 16 is not following the physical behavior of a properly operating solenoid.

The SENSE VOLTAGE signal from the drain of transistor 20 is applied through capacitor 24 to an input of inverter 28 that provides amplification of any AC variation across capacitor 24. The trip threshold point of inverter 28 is set to 2.0 volts. The output of inverter 28 is coupled to an inverting input of comparator 30 and to an inverting input of comparator 32. The non-inverting input of comparator 30 receives reference potential $V_{REF1}$ operating at 3.0 volts. The non-inverting input of comparator 32 receives reference potential $V_{REF2}$ operating at 1.0 volts. In an alternate embodiment, inverter 28 may be replaced by a comparator circuit (not shown) with its inverting input coupled to capacitor 24 and its non-inverting input referenced to a threshold potential mid-range point between $V_{REF1}$ and $V_{REF2}$, e.g. 2.0 volts. In addition, the reference voltage may be used to adjust noise immunity by controlling the minimum peak to valley excursion of the SENSE VOLTAGE as seen in FIG. 2.

The SENSE VOLTAGE is also applied to the non-inverting input of comparator 34. The inverting input of comparator 34 receives reference potential $V_{REF3}$ operating at 2.5 volts, while the output of comparator 34 provides a RESET signal. The output of comparator 30 provides an UP control signal to an input of inverter 36 and to a first input of AND gate 38. The output of AND gate 38 is coupled to a first input of OR gate 40. The second input of OR gate 40 receives the RESET signal for providing a SWITCH CONTROL signal to a control input of switching circuit 42. Switching circuit 42 is coupled between the input and output of inverter 28. The output of inverter 36 provides an UP control signal to up/down counter 44, while the output of comparator 32 provides the DOWN control signal to counter 44. Counter 44 is held at count value zero by a logic one RESET signal at its reset input. Oscillator 46 provides an OSCILLATOR signal operating at 10.0 kilohertz to a second input of AND gate 38 and to the clock input of counter 44. A logic one UP control signal causes counter 44 to count up at the frequency of the OSCILLATOR signal, while a logic one DOWN control signal causes counter 44 to count down at the frequency of the OSCILLATOR signal. Counter 44 provides a logic one ZERO signal when its count value is zero and a logic one VALID COUNT signal when its count value is equal to or greater than a predetermined threshold, say a count of five. The VALID COUNT signal is applied at a set input of flipflop 50 while its reset input receives the RESET signal. The Q-output of flipflop 50 is coupled to a first input of AND gate 52, while the second input of AND gate 52 receives the ZERO signal. Flipflop 54 has a set input coupled to the output of AND gate 52 and receives the RESET signal at its reset input. Flipflops 50 and 54 are clocked by the OSCILLATOR signal. The Q-output of flipflop 54 provides an ENGAGED signal that indicates solenoid 12 is properly engaged.

The operation of actuator movement detector 10 proceeds as follows. When the ACTUATOR CONTROL signal is low, transistor 20 is off and no current flows through field coil 16. The SENSE VOLTAGE is substantially equal to $V_{POWER}$. Since the SENSE VOLTAGE at the non-inverting input of comparator 34 is greater than the 2.5 volt reference voltage $V_{REF3}$, the RESET signal is logic one and the output of OR gate 40 is logic one. The logic one from OR gate 40 holds switching circuit 42 in a closed position forcing inverter 28 to regulate at a potential between $V_{REF1}$ and $V_{REF2}$. The logic one RESET signal disables counter 44 by holding it at count zero and further resets the outputs of flipflops 50 and 54 to logic zeroes to disable the operation of actuator movement detector 10.

When the ACTUATOR CONTROL signal goes high to enable solenoid 12, transistor 20 turns on and current flows through field coil 16. As seen in FIG. 2, the SENSE VOLTAGE momentarily drops to near zero volts at time $t_1$ because the current through field coil 16 does not change instantaneously. The SENSE VOLTAGE at the non-inverting input of comparator 34 is less than the 2.5 volt reference voltage $V_{REF3}$ and the RESET signal goes to logic zero to release the reset input of counter 44 and flipflops 50 and 54 and allows actuator movement detector 10 to begin operation.

During time $t_1$-$t_4$ after engaging solenoid 12 the current through field coil 16 increases in magnitude exponentially. The SENSE VOLTAGE signal voltage is divided into discrete sample periods as determined by the frequency of oscillator 46. The SENSE VOLTAGE and any system offsets due to external conditions such as temperature and process variation are stored across capacitor 24 during the time that switching circuit 42 is closed.

Assume the UP control signal starts at logic one. At time $t_2$, the OSCILLATOR signal pulses high and combines with the logic one UP control signal to close switching circuit 42 and stores the present value of the SENSE VOLTAGE and any system offsets across capacitor 24. Just after time $t_2$, the OSCILLATOR signal goes low and the output of AND gate 38 goes low and the output of OR gate 40 goes low to open switching circuit 42. With switching circuit 42 open, any AC variation of the SENSE VOLTAGE, i.e. exponentially increasing SENSE VOLTAGE, is amplified and inverted by inverter 28. The SENSE VOLTAGE produces a low signal at the inverting inputs of comparators 30 and 32 that is less than $V_{REF1}$ and $V_{REF2}$. The UP control signal and DOWN control signal remain at logic one to keep counter 44 at count value zero and the ZERO signal at logic one. The UP control signal from inverter 36 is logic zero to counter 44. At time $t_3$, oscillator 46 provides another short positive pulse to momentarily close switching circuit 42 and update the present value of the SENSE VOLTAGE and system offsets across capacitor 24. Inverter 28 and comparators 30 and 32 thus detect AC variation of the SENSE voltage and providing counter control signals having a first state when the SENSE VOLTAGE increases in magnitude. The process repeats in sampling periods until the peak value at time $t_4$.

Inverter 28 and comparators 30 and 32 provide a peak detection of the SENSE VOLTAGE signal. The sampling period between times $t_4$ and $t_5$ shows a decrease in magnitude in the SENSE VOLTAGE to start the dip portion of the waveform. The decreasing SENSE VOLTAGE becomes less than the present value stored across capacitor 24 causing the output of inverter 28 to go to a high value greater than $V_{REF1}$ and $V_{REF2}$. The UP control signal and DOWN control signal become logic zero and the UP control signal goes to logic one. The logic zero UP control signal produces a logic zero at the output of AND gate 38 and holds switching circuit 42 in an open state, effectively storing the peak value of the SENSE VOLTAGE across capacitor 24. Inverter 28 and comparators 30 and 32 thus detect AC variation of the SENSE voltage and providing counter control signals having a second state when the SENSE VOLTAGE decreases in magnitude.

Counter 44 begins to count up at time $t_4$ as determined by the OSCILLATOR frequency until time $t_6$ when the SENSE VOLTAGE again exceeds the peak value stored across capacitor 24. The instantaneous slope of the SENSE VOLTAGE is irrelevant between times $t_4$ and $t_6$. The VALID COUNT signal goes to logic one when counter 44 is greater than or equal to a predetermined count value, e.g. value five. In order to assert a logic one ENGAGED signal to verify proper operation of solenoid 12, counter 44 must reach the predetermined value of count five after the time of the first peak at time $t_4$ and then count back down to zero between the times $t_6$ and $t_7$. Counter 44 enhances noise immunity by providing a digital filtering function in that spurious up and down counts in a noisy environment average to zero. Counter 44 must receive five more up counts than down counts to reach the desired count of five.

Assume counter 44 reaches a count value of at least five between times $t_4$ and $t_6$. By reaching the count value five, the dip portion of the SENSE VOLTAGE is determined to have a minimum acceptable duration that indicates field coil 16 is properly operating to move actuator 14. The VALID COUNT signal is logic one and sets flipflop 50 so that its Q-output goes to logic one. The ZERO output of counter 44 remains logic zero. At time $t_6$ the SENSE VOLTAGE exceeds the peak voltage stored across capacitor 24 at which time inverter 28 produces a low signal to change the output states of comparators 30 and 32 to logic ones. With a logic one DOWN control signal, counter 44 begins a count down sequence at the OSCILLATOR frequency. By time $t_7$ counter 44 counts back down to all zeros and the ZERO output goes to logic one and combines with the logic one from flipflop 50 to produce a logic one at the output of AND gate 52. The logic one from AND gate 52 sets the ENGAGED signal at the Q-output of flipflop 54 to logic one to indicate that solenoid 12 is engaged.

If counter 44 fails to reaches a count value of at least five between times $t_4$ and $t_6$, then the low peak of the SENSE VOLTAGE is determined not to have the minimum acceptable duration. Field coil 16 is not properly operating and actuator 14 may not have moved. The VALID COUNT signal is logic zero and the Q-output of flipflop 50 remains at logic zero. The ZERO output of counter 44 remains logic zero. At time $t_6$ the SENSE VOLTAGE exceeds the peak voltage stored across capacitor 24 at which time inverter 28 produces a low signal to change the output states of comparators 30 and 32 to logic ones. With a logic one DOWN control signal, counter 44 begins a count down sequence at the OSCILLATOR frequency. At time $t_7$ counter 44 counts back down to all zeros and the ZERO output goes to logic one and combines with the logic zero from flipflop 50 to produce a logic zero at the output of AND gate 52. The logic zero from AND gate 52 keeps the ENGAGED signal at the Q-output of flipflop 54 at logic zero to indicate that solenoid 12 may not be engaged.

Figure 3:
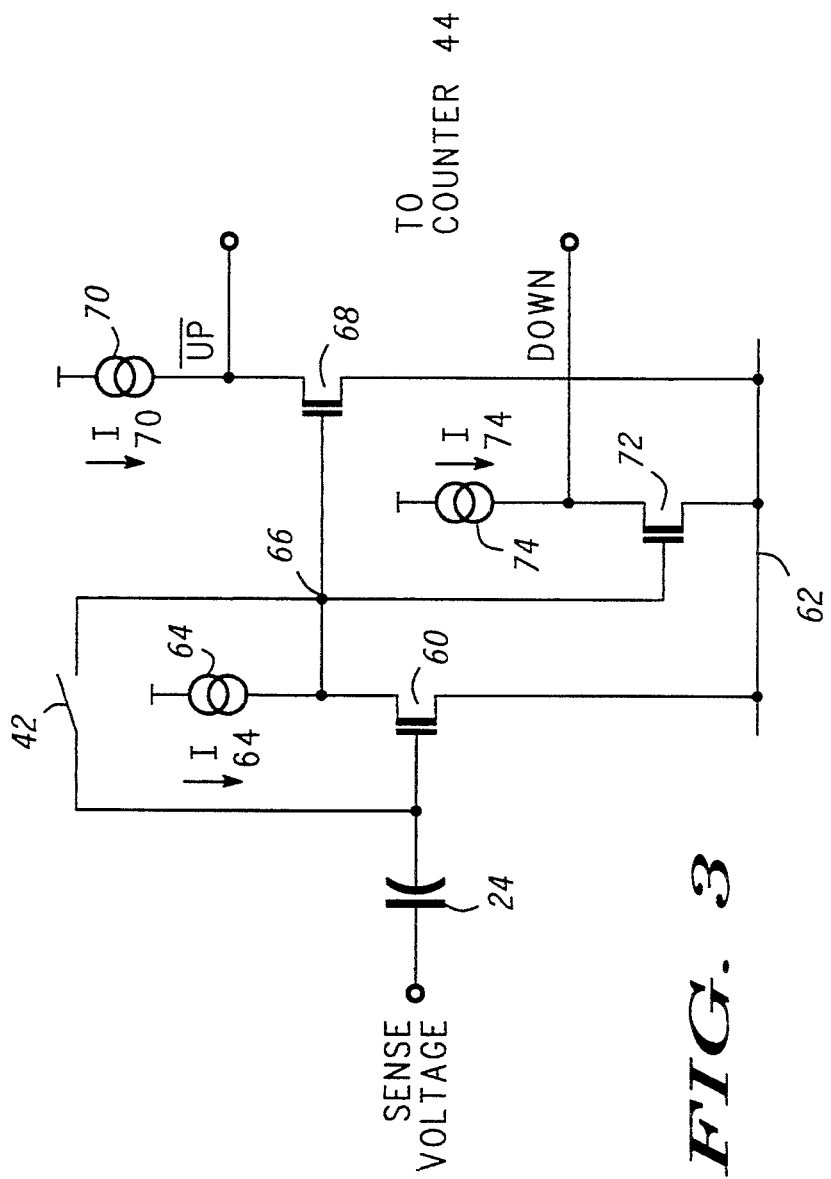
FIG. 3 is a schematic diagram illustrating an alternate embodiment of the peak detector of FIG. 1.

An alternate embodiment of the peak detector portion of actuator movement detector 10 is shown in FIG. 3. Components have a similar function are assigned the same reference numbers used in FIG. 1. Switching circuit 42 is coupled between the gate and drain of transistor 60. The source of transistor 60 is coupled to power supply conductor 62 operating at ground potential. The drain of transistor 60 receives current $I_{64}$ from current source 64 into node 66. The gate of transistor 68 is coupled to node 66 and receives current $I_{70}$ from current source 70 into its drain. The gate of transistor 72 is coupled to node 66 and receives current $I_{74}$ from current source 74 into its drain. The sources of transistors 68 and 72 are coupled to power supply conductor 62. Current sources 64, 70 and 74 are each selected at 100.0 microamps. The drain of transistor 68 provides the UP control signal while the drain of transistor 72 provides the DOWN control signal.

Transistor 60 provides an inverting function in that a high signal at its gate turns on transistor 60 and reduces the voltage at node 66 to a low level. Conversely, a low signal at the gate of transistor 60 disables its operation and allows the voltage at node 66 to rise thus providing an inverting operation. Transistor 60 also provides an amplification of AC variation about the steady state value stored across capacitor 24. Transistors 68 and 72 are sized to provide a 1.0 volt offset between their switching thresholds. For example, the voltage at node 66 must exceed 3.0 volts to turn on transistor 68 and pull the UP control signal to logic zero. Similarly, the voltage at node 66 must fall below 1.0 volt to turn on transistor 72 to pull the DOWN control signal to logic one. When the voltage at node 66 is less than 1.0 volts, transistor 72 is off and the DOWN control signal goes to logic one. Likewise, when the voltage at node 66 is less than 3.0 volts transistor 68 is off and the UP control signal is logic one.

By now it should be appreciated that the present invention provides an indicator to verify proper engagement of a solenoid. Verifying proper actuator movement is important in many applications such as shifting automotive transmissions and engaging emission control systems. The current flowing through the field coil is converted to a sense voltage that exponentially increases and then follows a low peak before increases again to a steady state value greater than the first peak value. The actuator movement detector determines the first peak value of the exponentially increasing sense voltage. After the first peak, a counter must count to a predetermined value during the low peak before the sense voltage returns to its first peak value. If the counter reaches at least the predetermined count value, then the current through the field coil is following the proper physical behavior and the solenoid is considered engaged. If the counter fails to reach the predetermined count value, then the solenoid is not engaged because the current through field coil 16 is not following the physical behavior of a properly operating solenoid. The actuator movement detector may be added to existing solenoid systems by tapping a sense voltage off the field coil.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An actuator movement detector circuit, comprising:
   a capacitor having a first terminal coupled for receiving a sense voltage;
   circuit means having an input coupled to a second terminal of said capacitor for detecting AC variation of said sense voltage and providing a first counter control signal having a first logic state when said sense voltage increases in magnitude and a second logic state when said sense voltage decreases in magnitude; and
   a counter having a first control input receiving said first counter control signal and having a clock input coupled for receiving an oscillator signal for providing a valid count signal indicating actuator movement.

2. The actuator movement detector circuit of claim 1 wherein said circuit means includes:
   a first inverter having an input coupled to said second terminal of said capacitor;
   a switching circuit coupled between said input of said first inverter and an output of said first inverter and operating in response to a switch control signal;

a first comparator having first and second inputs and an output, said first input being coupled to said output of said first inverter, said second input being coupled for receiving a first reference potential, said output providing said first counter control signal; and a second comparator having first and second inputs and an output, said first input being coupled to said output of said first inverter, said second input being coupled for receiving a second reference potential, said output providing a second counter control signal to a second control input of said counter.

3. The actuator movement detector circuit of claim 2 wherein said circuit means further includes:

a second inverter having an input coupled to said output of said first comparator and having an output coupled to said first control input of said counter; and a first logic gate having first and second inputs and an output, said first input being coupled for receiving said oscillator signal, said second input being coupled to said output of said first comparator, said output providing said switch control signal.

4. The actuator movement detector circuit of claim 3 further includes:

a third comparator having first and second inputs and an output, said first input being coupled for receiving said sense voltage, said second input being coupled for receiving a third reference potential, said output providing a reset signal to a reset input of said counter; and a second logic gate having first and second inputs and an output, said first input being coupled for receiving said reset signal, said second input being coupled to said output of said first logic gate, said output being coupled to a control input of said switching circuit.

5. The actuator movement detector circuit of claim 4 further includes an oscillator for providing said oscillator signal.

6. The actuator movement detector circuit of claim 5 further includes:

a first flipflop having a set input, a reset input, a clock input, and an output, said set input being coupled for receiving said valid count signal from said counter, said reset input being coupled for receiving said reset signal, said clock input being coupled for receiving said oscillator signal;

a third logic gate having first and second inputs and an output, said first input being coupled to said output of said first flipflop, said second input being coupled for receiving a zero signal from said counter indicating a zero state; and a second flipflop having a set input, a reset input, a clock input, and an output, said set input being coupled to said output of said third logic gate, said reset input being coupled for receiving said reset signal, said clock input being coupled for receiving said oscillator signal, said output providing an engaged signal indicating actuator movement.

7. The actuator movement detector circuit of claim 1 wherein said circuit means includes:

a first current source providing a first current;

a first transistor having a gate, a drain and a source, said gate being coupled to said second terminal of said capacitor, said source being coupled to a first power supply conductor, said drain being coupled for receiving said first current;

a switching circuit coupled between said gate of said first transistor and said drain of said first transistor and operating in response to a switch control signal;

a second current source providing a second current;

a second transistor having a gate, a drain and a source, said gate being coupled to said drain of said first transistor, said source being coupled to said first power supply conductor, said drain being coupled for receiving said second current and providing said first counter control signal;

a third current source providing a third current; and a third transistor having a gate, a drain and a source, said gate being coupled to said drain of said first transistor, said source being coupled to said first power supply conductor, said drain being coupled for receiving said third current and providing a second counter control signal.

8. The actuator movement detector circuit of claim 7 wherein said circuit means further includes:

a second inverter having an input coupled to said drain of said second transistor and having an output coupled to said first control input of said counter;

a first logic gate having first and second inputs and an output, said first input being coupled for receiving said oscillator signal, said second input being coupled to said drain of said second transistor, said output providing said switch control signal;

a comparator having first and second inputs and an output, said first input being coupled for receiving said sense voltage, said second input being coupled for receiving a reference potential, said output providing a reset signal to a reset input of said counter;

a second logic gate having first and second inputs and an output, said first input being coupled for receiving said reset signal, said second input being coupled to said output of said first logic gate, said output being coupled to a control input of said switching circuit; and an oscillator for providing said oscillator signal.

9. The actuator movement detector circuit of claim 8 further includes:

a first flipflop having a set input, a reset input, a clock input, and an output, said set input being coupled for receiving said valid count signal from said counter, said reset input being coupled for receiving said reset signal, said clock input being coupled for receiving said oscillator signal;

a third logic gate having first and second inputs and an output, said first input being coupled to said output of said first flipflop, said second input being coupled for receiving a zero signal from said counter indicating a zero state; and a second flipflop having a set input, a reset input, a clock input, and an output, said set input being coupled to said output of said third logic gate, said reset input being coupled for receiving said reset signal, said clock input being coupled for receiving said oscillator signal, said output providing an engaged signal indicating actuator movement.

10. A method of detecting actuator movement, comprising the steps:

storing a sense voltage across a capacitor;

detecting AC variation of said sense voltage and providing a count control signal having a first logic state when said sense voltage increases in magnitude and a second logic state when said sense voltage decreases in magnitude;

counting down periods of an oscillator signal during said first logic state of said count control signal; and counting up periods of said oscillator signal during said second logic state of said count control signal for providing an output signal indicating actuator movement.

11. The method of claim 10 further comprising the steps:

monitoring said sense voltage for an initial change in value; and determining a first peak value of said sense voltage upon detecting said initial change.

12. The method of claim 11 further comprising the step of re-obtaining a second value said sense voltage equal to said first peak value.

13. The method of claim 12 further comprising the steps of:

determining duration of a dip in said sense voltage between said first peak value and said second value where said second value is followed by a minimum positive slope for a minimum duration; and asserting said output signal upon finding said minimum duration of said dip in said sense voltage to indicate actuator movement.

14. An actuator detector circuit, comprising:

a capacitor having a first terminal coupled for receiving a sense voltage;

circuit means having an input coupled to a second terminal of said capacitor for detecting AC variation of said sense voltage and providing a first counter control signal having a first logic state when said sense voltage increases in magnitude and a second logic state when said sense voltage decreases in magnitude;

a counter having a first control input receiving said first counter control signal, a reset input coupled for receiving a reset signal, and a clock input coupled for receiving an oscillator signal for providing a valid count signal and a zero signal indicating a zero state;

a first flipflop having a set input, a reset input, a clock input, and an output, said set input being coupled for receiving said valid count signal from said counter, said reset input being coupled for receiving said reset signal, said clock input being coupled for receiving said oscillator signal;

a third logic gate having first and second inputs and an output, said first input being coupled to said output of said first flipflop, said second input being coupled for receiving said zero signal from said counter; and a second flipflop having a set input, a reset input, a clock input, and an output, said set input being coupled to said output of said third logic gate, said reset input being coupled for receiving said reset signal, said clock input being coupled for receiving said oscillator signal, said output providing an engaged signal indicating actuator movement.

15. The actuator detector circuit of claim 14 wherein said circuit means includes:

a first inverter having an input coupled to said second terminal of said capacitor;

a switching circuit coupled between said input of said first inverter and an output of said first inverter and operating in response to a switch control signal;

a first comparator having first and second inputs and an output, said first input being coupled to said output of said first inverter, said second input being coupled for receiving a first reference potential, said output providing said first counter control signal; and a second comparator having first and second inputs and an output, said first input being coupled to said output of said first inverter, said second input being coupled for receiving a second reference potential, said output providing a second counter control signal to a second control input of said counter.

16. The actuator detector circuit of claim 15 wherein said circuit means further includes:

a second inverter having an input coupled to said output of said first comparator and having an output coupled to said first control input of said counter; and a first logic gate having first and second inputs and an output, said first input being coupled for receiving said oscillator signal, said second input being coupled to said output of said first comparator, said output providing said switch control signal.

17. The actuator detector circuit of claim 16 further includes:

a third comparator having first and second inputs and an output, said first input being coupled for receiving said sense voltage, said second input being coupled for receiving a third reference potential, said output providing said reset signal; and a second logic gate having first and second inputs and an output, said first input being coupled for receiving said reset signal, said second input being coupled to said output of said first/Logic gate, said output being coupled to a control input of said switching circuit.

18. The actuator detector circuit of claim 17 further including an oscillator for providing said oscillator signal.

19. The actuator detector circuit of claim 14 wherein said circuit means includes:

a first current source providing a first current;

a first transistor having a gate, a drain and a source, said gate being coupled to said second terminal of said capacitor, said source being coupled to a first power supply conductor, said drain being coupled for receiving said first current;

a switching circuit coupled between said gate of said first transistor and said drain of said first transistor and operating in response to a switch control signal;

a second current source providing a second current;

a second transistor having a gate, a drain and a source, said gate being coupled to said drain of said first transistor, said source being coupled to said first power supply conductor, said drain being coupled for receiving said second current and providing said first counter control signal;

a third current source providing a third current; and a third transistor having a gate, a drain and a source, said gate being coupled to said drain of said first transistor, said source being coupled to said first power supply conductor, said drain being coupled for receiving said third current and providing a second counter control signal.

20. The actuator detector circuit of claim 19 wherein said circuit means further includes:

a second inverter having an input coupled to said drain of said second transistor and having an output coupled to said first control input of said counter;

a first logic gate having first and second inputs and an output, said first input being coupled for receiving said oscillator signal, said second input being coupled to said drain of said second transistor, said output providing said switch control signal;

a comparator having first and second inputs and an output, said first input being coupled for receiving said sense voltage, said second input being coupled for receiving a reference potential, said output providing a reset signal to a reset input of said counter;

a second logic gate having first and second inputs and an output, said first input being coupled for receiving said reset signal, said second input being coupled to said output of said first logic gate, said output being coupled to a control input of said switching circuit; and an oscillator for providing said oscillator signal.

* * * * *